(12) United States Patent
Jung et al.

(10) Patent No.: US 8,748,961 B2
(45) Date of Patent: Jun. 10, 2014

(54) BURIED BIT LINE PROCESS AND SCHEME

(75) Inventors: Le-Tien Jung, Taipei (TW);
Yung-Chang Lin, Taichung (TW)

(73) Assignee: Taiwan Memory Corporation,
Hsin-Chu (TW)

( * ) Notice: Subject to any disclaimer, the term of this patent is extended or adjusted under 35 U.S.C. 154(b) by 722 days.

(21) Appl. No.: 12/940,207

(22) Filed: Nov. 5, 2010

(65) Prior Publication Data

US 2011/0101435 A1    May 5, 2011

(30) Foreign Application Priority Data

Nov. 5, 2009  (TW) ............................ 98137532 A

(51) Int. Cl.
*H01L 29/94* (2006.01)

(52) U.S. Cl.
USPC ............. 257/301; 257/506; 257/E21.396; 257/E29.346

(58) Field of Classification Search
USPC ............. 257/301, 506, E21.396, E29.346
See application file for complete search history.

(56) References Cited

U.S. PATENT DOCUMENTS

| | | | | |
|---|---|---|---|---|
| 5,102,817 A | * | 4/1992 | Chatterjee et al. | 438/242 |
| 6,808,979 B1 | * | 10/2004 | Lin et al. | 438/242 |
| 2003/0003651 A1 | | 1/2003 | Divakaruni et al. | |
| 2004/0036519 A1 | * | 2/2004 | Wu | 327/296 |
| 2007/0235833 A1 | * | 10/2007 | Cheng et al. | 257/506 |

FOREIGN PATENT DOCUMENTS

| | | |
|---|---|---|
| JP | 63-244769 A | 10/1988 |
| TW | 324112 | 1/1998 |

* cited by examiner

*Primary Examiner* — Marc Armand
(74) *Attorney, Agent, or Firm* — Birch, Stewart, Kolasch & Birch, LLP

(57) ABSTRACT

The embodiment provides a buried bit line process and scheme. The buried bit line is disposed in a trench formed in a substrate. The buried bit line includes a diffusion region formed in a portion of the substrate adjacent the trench. A blocking layer is formed on a portion sidewall of the trench. A conductive plug is formed in the trench, covering sidewalls of the diffusion region and the blocking layer.

22 Claims, 16 Drawing Sheets

BURIED BIT LINE PROCESS AND SCHEME

BACKGROUND OF THE INVENTION

1. Field of the Invention

The present invention relates to a dynamic random access memory (DRAM) cell process and scheme, and in particular, to buried bit line of a dynamic random access memory (DRAM) cell process and scheme.

2. Description of the Related Art

A dynamic random access memory (DRAMs) is one type of volatile memories. The basic operation principle of the DRAM utilizes the amount electric charges stored in a capacitor to represent bit '1' or bit '0' in the binary system for data storage. For high density requirements, the most effective method for the device size reduction now is through reducing process technology node and using a unit design technology. Another method for the device size reduction is achieved by a more effective array structure. After developing for several generations, the storage technology is usually limited by some kind of the unit layout. Also, every improvement of the unit size reduction needs a great amount of work to reduce the critical size of the etching technology.

Thus, a novel a dynamic random access memory (DRAM) cell process and scheme are desired to overcome the aforementioned problems.

BRIEF SUMMARY OF INVENTION

A dynamic random access memory (DRAM) cell process and scheme are provided. An exemplary embodiment of a buried bit line disposed in a trench of a substrate comprises a diffusion region formed in a portion of the substrate adjacent to the trench. A blocking layer is formed on a portion of a sidewall of the trench. A conductive plug is formed in the trench, covering sidewalls of the diffusion region and the blocking layer.

An exemplary embodiment of a buried bit line process comprises providing a substrate. A trench is formed in the substrate. A blocking layer is formed on a portion of a sidewall of the trench. A diffusion region is formed in a portion of the substrate adjacent to the trench. A conductive plug is formed in the trench, covering a sidewall of the diffusion region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
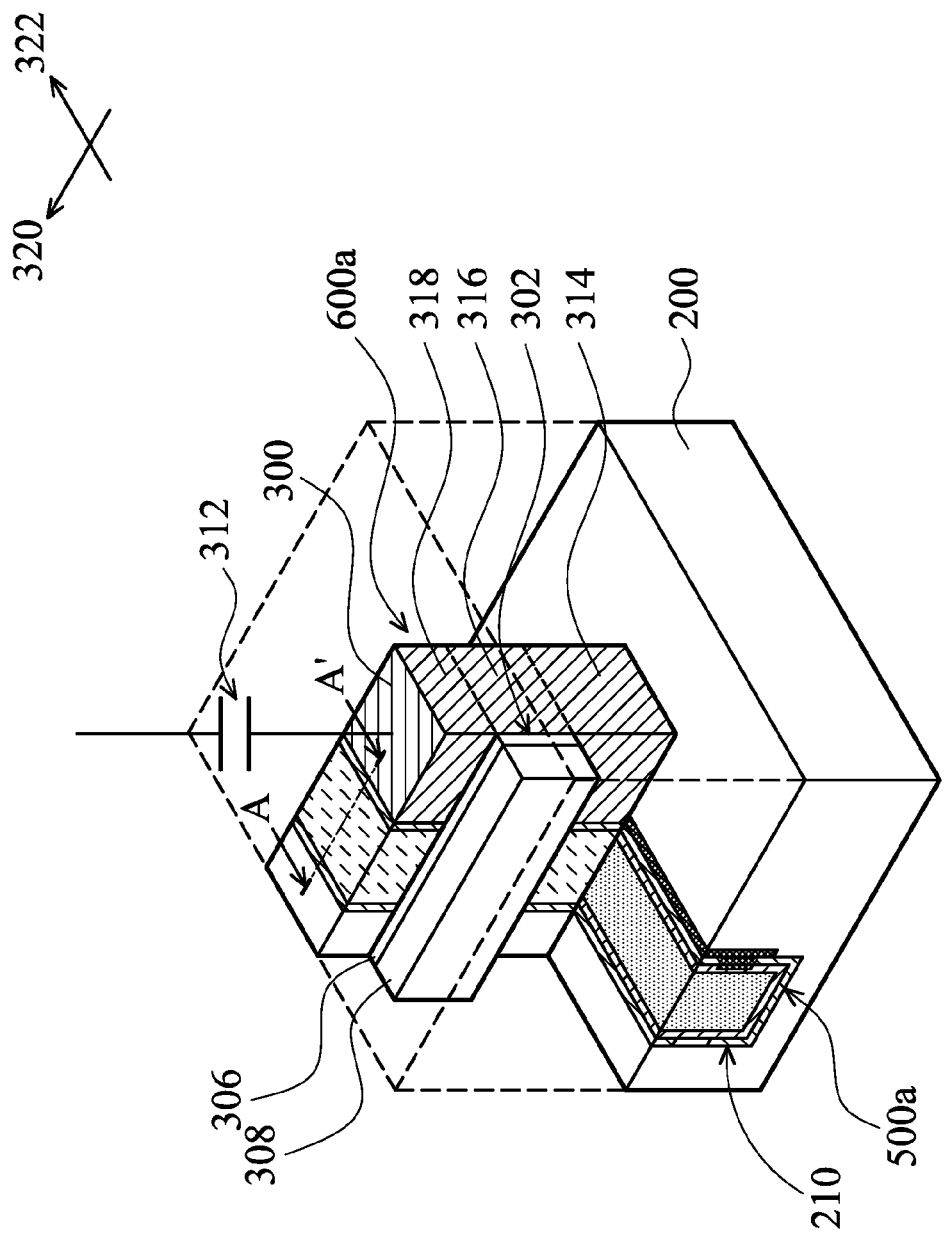
FIG. 1a is a perspective view showing one exemplary embodiment of a dynamic random access memory cell of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 1B:
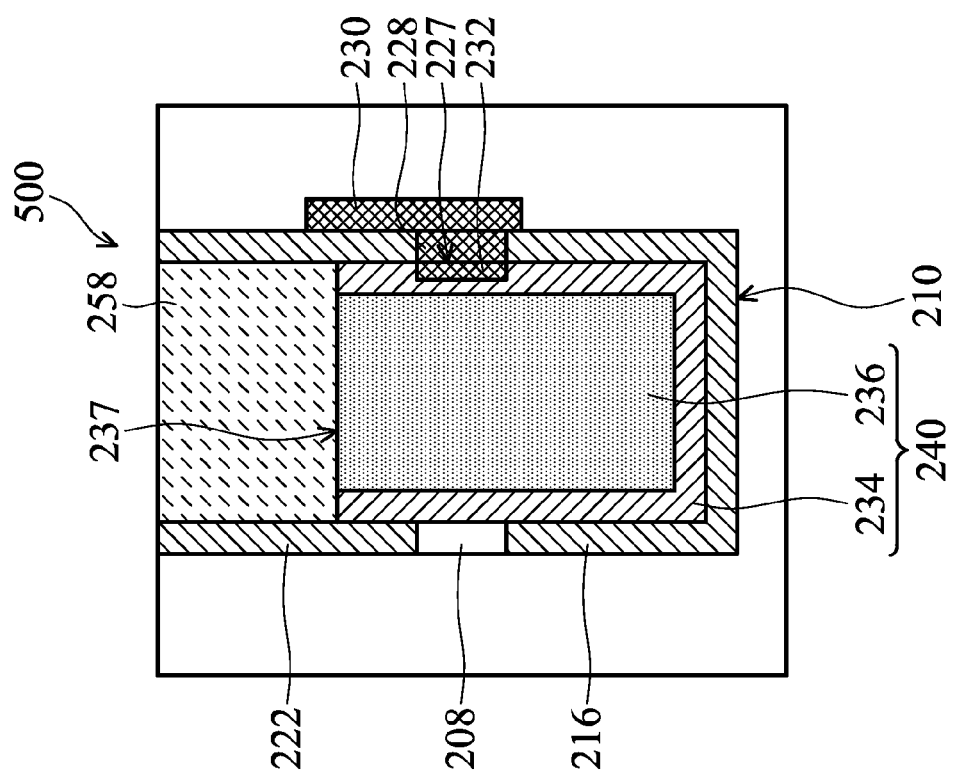
FIG. 1b is a cross section view taken of a line A-A' of FIG. 1a, showing one exemplary embodiment of a buried bit line of a dynamic random access memory cell of the invention.

FIG. 1a is a perspective view showing one exemplary embodiment of a dynamic random access memory cell (for short, a DRAM cell) 600a of the invention. In one embodiment, the DRAM cell 600a has a cell size of about $4F^2$ (F indicates the minimum size for a photolithography process or a unit size). As shown in FIG. 1a, a vertical transistor 300, a buried bit line (BL) 500a and a word line (WL) 308 of the DRAM cell 600a are disposed in a substrate 200. As shown in FIG. 1a, a vertical transistor 300 is formed in the substrate 200. The vertical transistor 300 has a drain region 314 at a lower-level, a channel region 316 at a middle-level, a source region 318 at an upper-level, which are laminated vertically. Additionally, the vertical transistor 300 has at least one vertical sidewall 302. The WL 308 is formed in the substrate 200 along a first direction 322, wherein the WL 308 is disposed on the vertical sidewall 302 of the vertical transistor 300, serving as a gate of the vertical transistor 300. An insulating layer 306 is disposed between the WL 308 and the vertical transistor 300, serving as a gate insulating layer of the vertical transistor 300. As shown in FIG. 1a, the DRAM cell 600a further comprises a BL 500a formed along a second direction 322 different from the first direction 322 in a trench 210 of the substrate 200, also, the BL 500a is disposed under the vertical transistor 300, electrically connecting to the drain region 314 of the vertical transistor 300. Moreover, the DRAM cell 600a further comprises a capacitor 312 electrically connecting to the source region 318 of the vertical transistor 300. FIG. 1b is a cross section view taken of a line A-A' of FIG. 1a, showing one exemplary embodiment of a buried bit line 500a of a DRAM cell of the invention. As shown in FIG. 1b, the buried BL 500a comprises a blocking layer 208 and an adjacent diffusion source layer 228 formed on a portion of a sidewall of the trench 210. Also, a conductive plug 420 is formed in the trench 210, covering sidewalls of the diffusion source layer 228 and the blocking layer 208.

Figure 2:
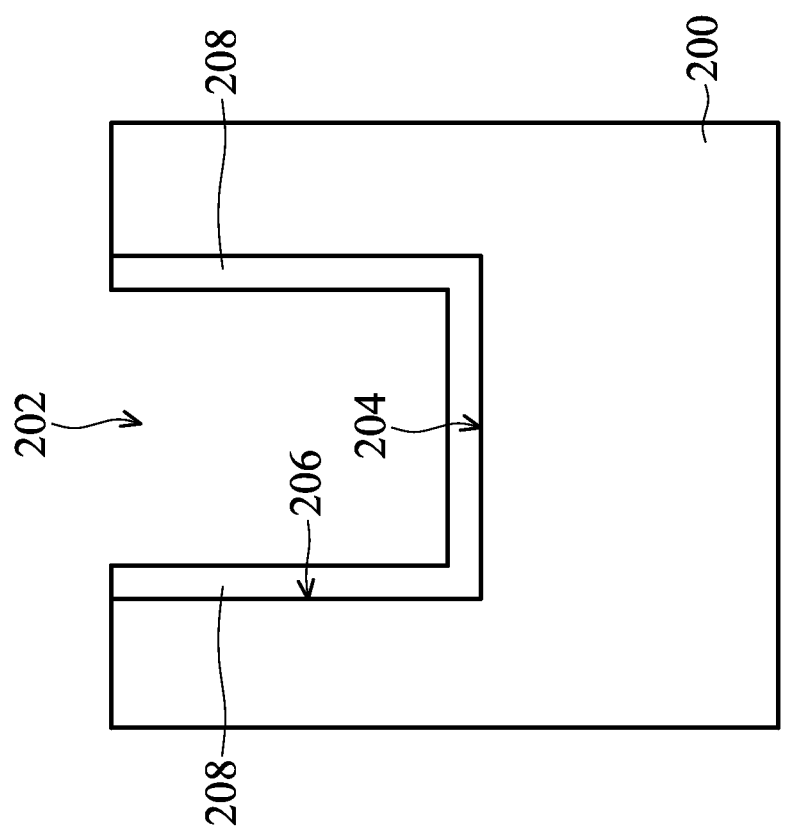
FIGS. 2-11 are cross section views for fabricating one exemplary embodiment of a buried bit line of a dynamic random access memory cell of the invention.

FIGS. 2-11 are cross section views for fabricating one exemplary embodiment of a buried bit line 500a of a dynamic random access memory cell 600a of the invention. As shown in FIG. 2, firstly, a substrate 200 is provided. In one embodiment, the substrate 200 may comprise a silicon substrate. In other embodiments, SiGe, bulk semiconductor, strained semiconductor, compound semiconductor, silicon on insulator (SOI) or other common used semiconductor substrates may be used as the substrate 200. The substrate 200 may be doped with a p-type dopant or an n-type dopant to change a conductive type thereof. In one embodiment, the substrate 200 may be doped with a p-type dopant. In one embodiment, a patterned hard mask layer (not shown) may be formed on the substrate 200 to define a formation position of a trench 202. In one embodiment, materials of the patterned hard mask layer may comprise silicon oxide, silicon nitride or combinations thereof. Next, an anisotropic etching process is performed using the patterned hard mask layer as an etching hard mask layer to form a sub-trench 202 in the substrate 200. Next, a blocking layer 208 may be conformably formed on a sidewall 206 and a bottom surface 204 of the sub-trench 202 using a chemical vapor deposition (CVD) or a physical vapor deposition (PVD) process. In one embodiment, the sub-trench 202 is used to define formation positions of subsequent formed bottom surfaces of blocking layer and diffusion source layer. In one embodiment, the blocking layer 208 may comprise an oxide layer, a nitride layer or combinations thereof. For example, the blocking layer 208 may be a laminated structure formed of an oxide layer covering the sidewall 206 of the sub-trench 202 and a nitride layer covering the oxide layer.

Figure 3:
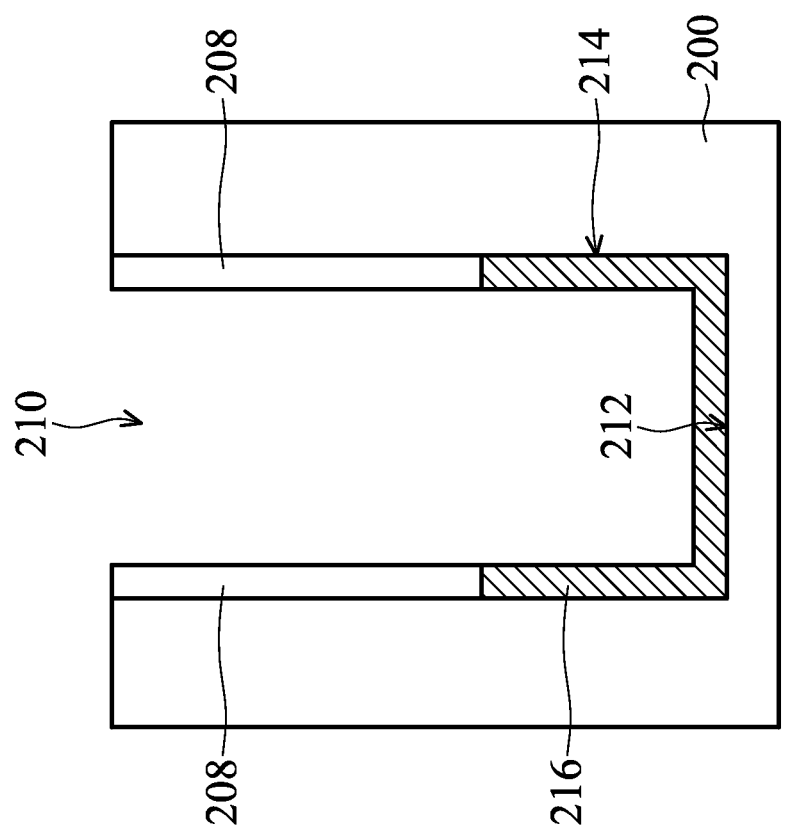

Next, referring to FIG. 3, an etching process can be further used to remove a portion of the blocking layer 208 and a portion of the substrate 200 underlying the blocking layer 208 from the bottom surface 204 of the sub-trench 202, thereby forming a trench 210 with exposing a bottom surface 212 and a sidewall 214. Next, a bottom insulating liner 216 may be conformably formed on the bottom surface 212 of the trench 210 and the sidewall 214 not covered by the blocking layer 208 using a method, for example, a thermal oxidation process. In one embodiment, the bottom insulating liner 216 may comprise an oxide layer, a nitride layer or combinations thereof. In this embodiment, the bottom insulating liner 216 may be an oxide layer.

Figure 4:
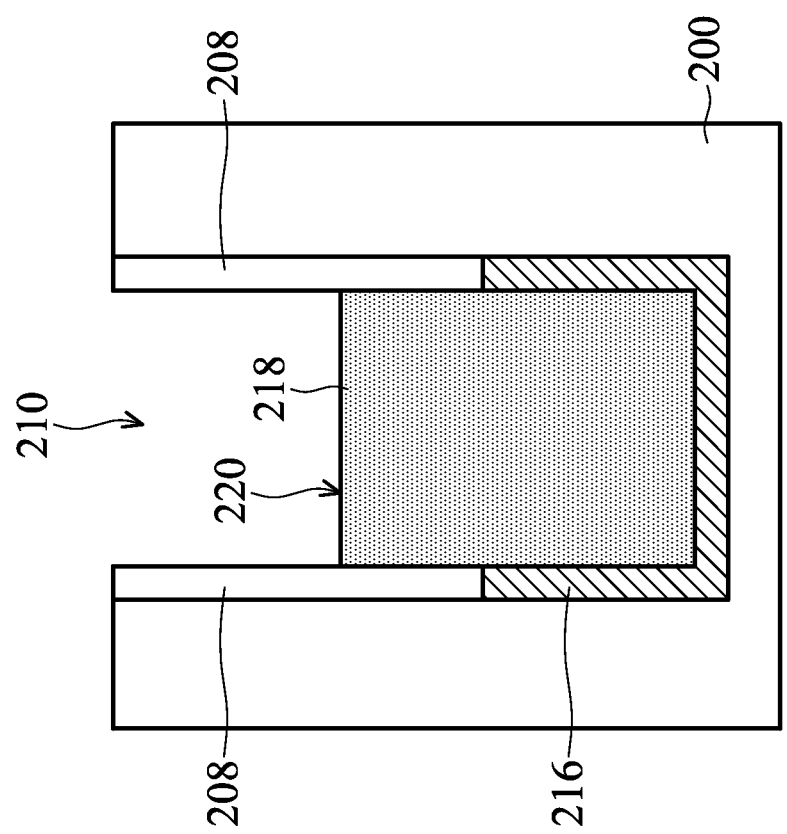

Next, referring to FIG. 4, a photoresist may be entirely formed, filling into the trench 210 using a coating process. Next, an etching back process may be used to remove a portion of the photoresist on the substrate 200 and in a portion of the trench 210, thereby forming a photoresist 218 in the trench 210, wherein the photoresist 218 covers the bottom insulating liner 216 and a portion of the blocking layer 208. As shown in FIG. 4, a top surface 220 of the photoresist 218 is lower than a top surface of the trench 210 and higher than the bottom insulating liner 216. In one embodiment, the top surface 220 of the photoresist 218 is used to define positions of top surfaces of subsequent formed blocking layer and diffusion source layer.

Figure 5:
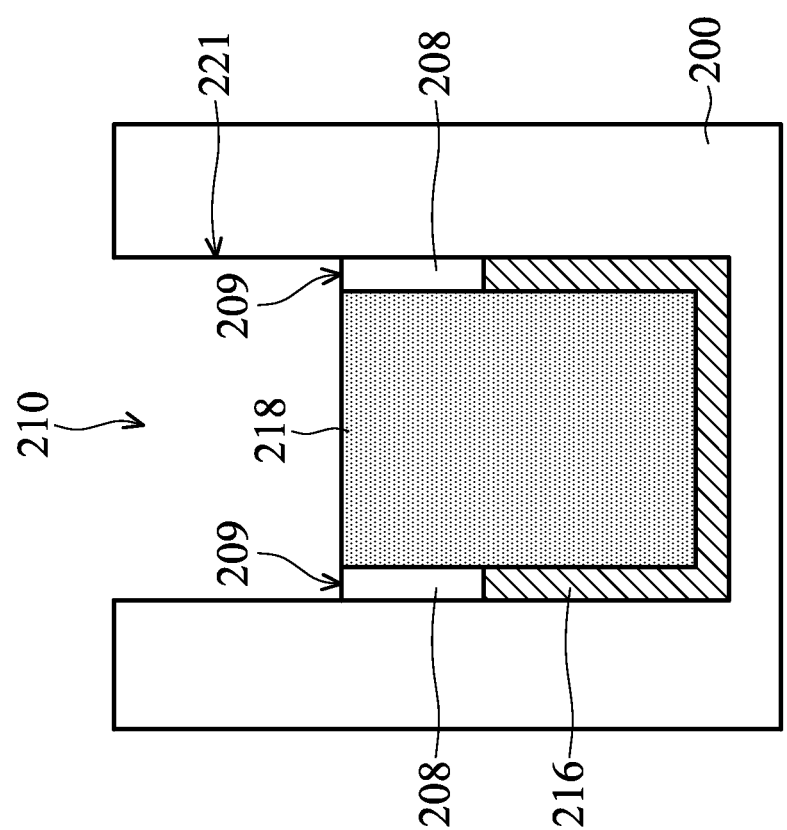

Next, referring to FIG. 5, the blocking layer 208 not covered by the photoresist 218 may be removed using an etching process to expose an upper sidewall portion 211 of the trench 210. A top surface 209 of the photoresist 218 is also defined after performing the etching process.

Figure 6:
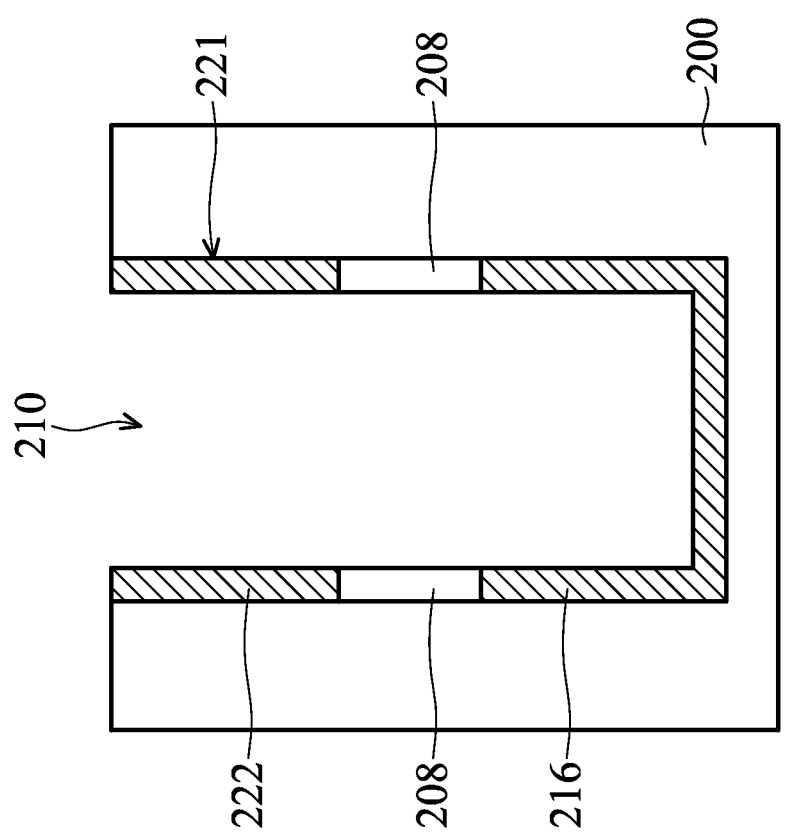

Next, referring to FIG. 6, the photoresist 218 is removed. A top insulating liner 222 is then formed on the exposed upper sidewall portion 211 of the trench 210 using a method, for example, a thermal oxidation process. In one embodiment, the top insulating liner 222 may comprise an oxide layer, a nitride layer or combinations thereof. In this embodiment, the top insulating liner 222 may be an oxide layer. As shown in FIG. 6, the bottom insulating liner 216 and the top insulating liner 222 are separated from each other by the blocking layer 208.

Figure 7:
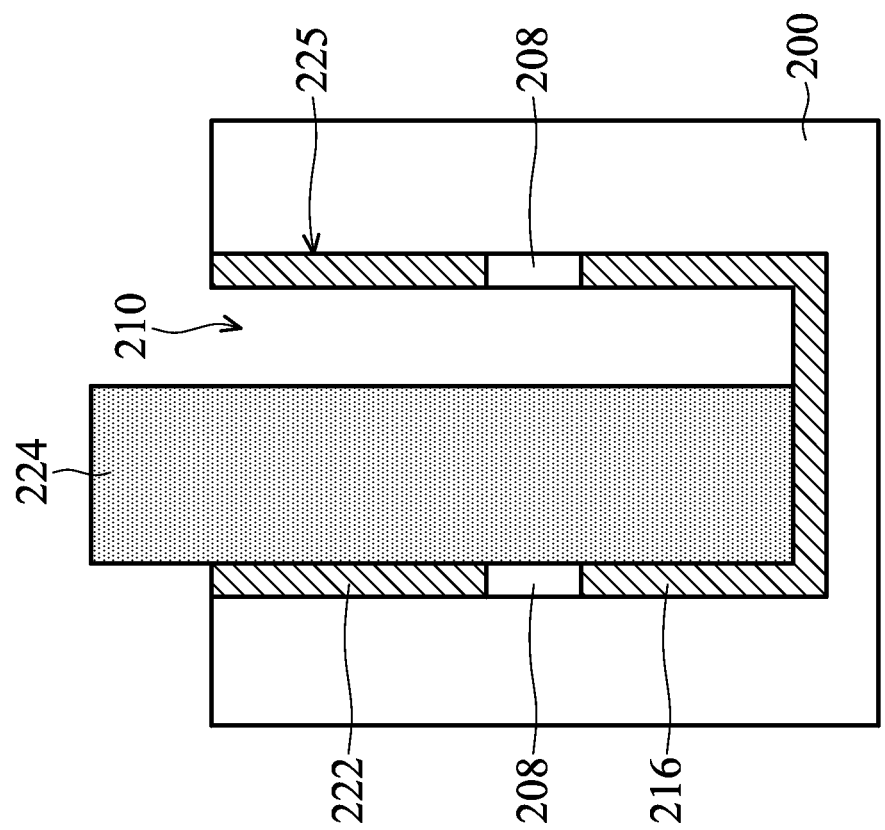
Figure 8:
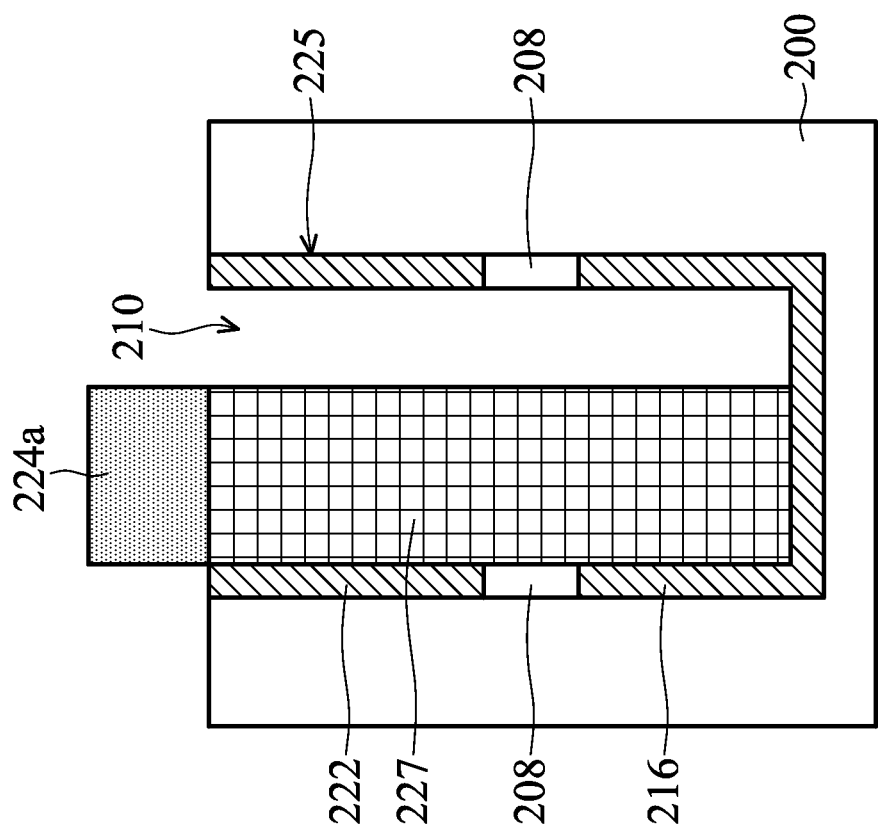

Next, a removed portion of the blocking layer 208 may be defined by a method as shown in FIGS. 7 and 8. FIG. 7 illustrates one embodiment of a method for removing a portion of the blocking layer 208. Referring to FIG. 7, a photoresist may be entirely formed, filling into the trench 210 using a coating process. Next, a patterned process may be performed to form a patterned photoresist 224 in the trench 210, wherein the patterned photoresist 224 covers a portion of the blocking layer 208, exposing a sidewall portion 225 of the trench 210, a portion of the top insulating liner 222 and a portion of the bottom insulating liner 216, which are on the bottom surface 212 the trench 210. The blocking layer 208 at a right side of the trench 210, for example, is exposed from the patterned photoresist 224.

In another embodiment, especially for a trench with a high aspect ratio, a portion of the blocking layer 208 may be removed by using a collocation of an insulating layer and a patterned photoresist. FIG. 8 illustrates another embodiment of a method of removing a portion of the blocking layer 208. Referring to FIG. 8, an insulating material (not shown) may be entirely formed, filling into the trench 210. In this embodiment, the insulating material may comprise polysilicon or oxides such as borophosphosilicate glass (BPSG). Next, a planarization process such as chemical mechanical polishing (CMP) process is performed to remove the insulating material over a surface of the substrate 200. Next, a patterned photoresist 224a is formed to cover a portion of the insulating material in the trench 210 using a photolithography process, wherein the patterned photoresist 224a is adjacent to the top insulating liner 222 at a left side of the trench 210. Next, an anisotropic etching process is performed to remove the insulating material not covered by the patterned photoresist 224a to form an insulating layer 227. As shown in FIG. 8, the insulating layer 227 covers a portion of the blocking layer 208, exposing a sidewall portion 225 of the trench 210, a portion of the top insulating liner 222 and a portion of the bottom insulating liner 216, which are on the bottom surface 212 the trench 210. The blocking layer 208 at the right side of the trench 210, for example, is exposed from the patterned photoresist 224a.

Figure 9:
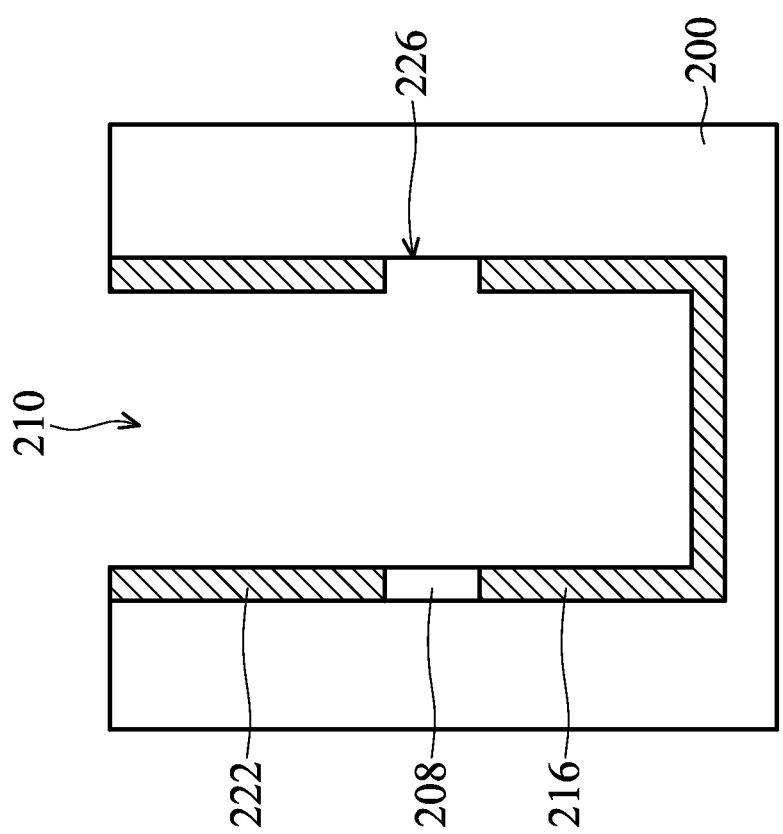

Next, a method of removing a portion of the blocking layer 208 to define a formation position of a subsequent diffusion source layer. Referring to FIG. 9, in one embodiment, after performing the process as shown in FIG. 7, the blocking layer 208 may be subjected by an etching process with a mask comprising the patterned photoresist 224, the top insulating liner 222 and the bottom insulating liner 216 not covered by the patterned photoresist 224. For example, because the blocking layer 208 may be a laminated structure constructed by nitride layers, the blocking layer 208 has a good etching selectively to the overlying top insulating liner 222 and the underlying bottom insulating liner 216, which are, for example, oxide layers. Therefore, after performing the etching process, the blocking layer 208 not covered by the patterned photoresist 224 may be removed to expose a sidewall portion 226 of the trench 210. Next, the patterned photoresist 224 is removed. Or, in one embodiment, FIG. 8 may be followed by FIG. 9, after removing the patterned photoresist 224 as shown in FIG. 8, the blocking layer 208 may be subjected by an etching process using a mask comprising the insulating layer 227, the top insulating liner 222 and the bottom insulating liner 216 not covered by the insulating layer 227. The blocking layer 208 not covered by the insulating layer 227 is removed, and a sidewall portion 226 of the trench 210 is exposed after performing the etching process.

Figure 10:
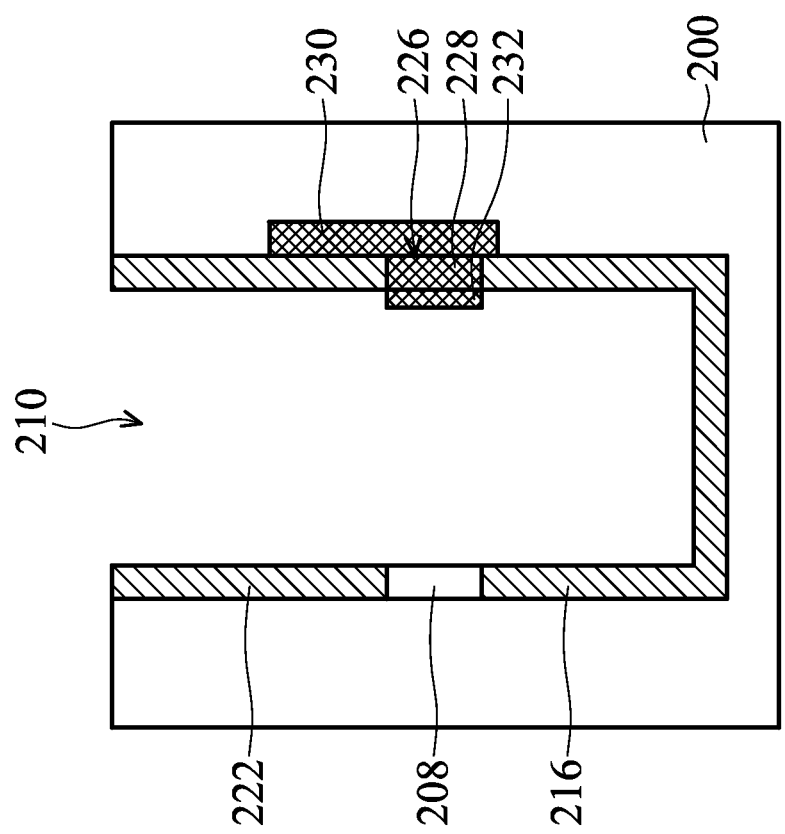

Next, referring to FIG. 10, a pre-cleaning process may be performed to remove a native oxide on the sidewall 226 of the trench 210. Next, a diffusion source layer 228 may be formed on the exposed sidewall 226 of the trench 210 using a thin film deposition process such as a CVD process and a subsequent etching back process. As shown in FIG. 9, the diffusion source layer 228 is adjacent to the blocking layer 208. Also, the diffusion source layer 228 and the blocking layer 208 are at the same level. In one embodiment, the diffusion source layer 228 may be a conductive layer comprising a doped polysilicon layer, for example, an As-doped polysilicon layer. Next, a dopant of the diffusion source layer 228 may be diffused into the substrate 200 adjacent to the diffusion source layer 228 using an annealing process, such that a diffusion region 230 is formed in a portion the substrate 200 adjacent to the diffusion source layer 228. In one embodiment, the diffusion region 230 may serve as a diffusion junction between the bit line and the vertical transistor. And the subsequent formed conductive plug is electrically connected to the drain of the vertical transistor through the diffusion source layer 228 and the diffusion region 230. In one embodiment which a conductive type of the substrate 200 is p-type, a conductive type of the diffusion region 230 is n-type. The conductive type of the diffusion region 230 is defined according to a conductive type of the dopant of the diffusion source layer 228, but not limited to the disclosed embodiments. Next, a silicide layer 232 is formed in the trench 210, covering a sidewall of the diffusion source layer 228 by performing a silicidation process. In one embodiment, the silicide layer 232 may comprise titanium silicide or cobalt silicide, and the silicide layer 232 may be used to reduce a resistance between the diffusion source layer 228 and the subsequent formed conductive plug.

Figure 11:
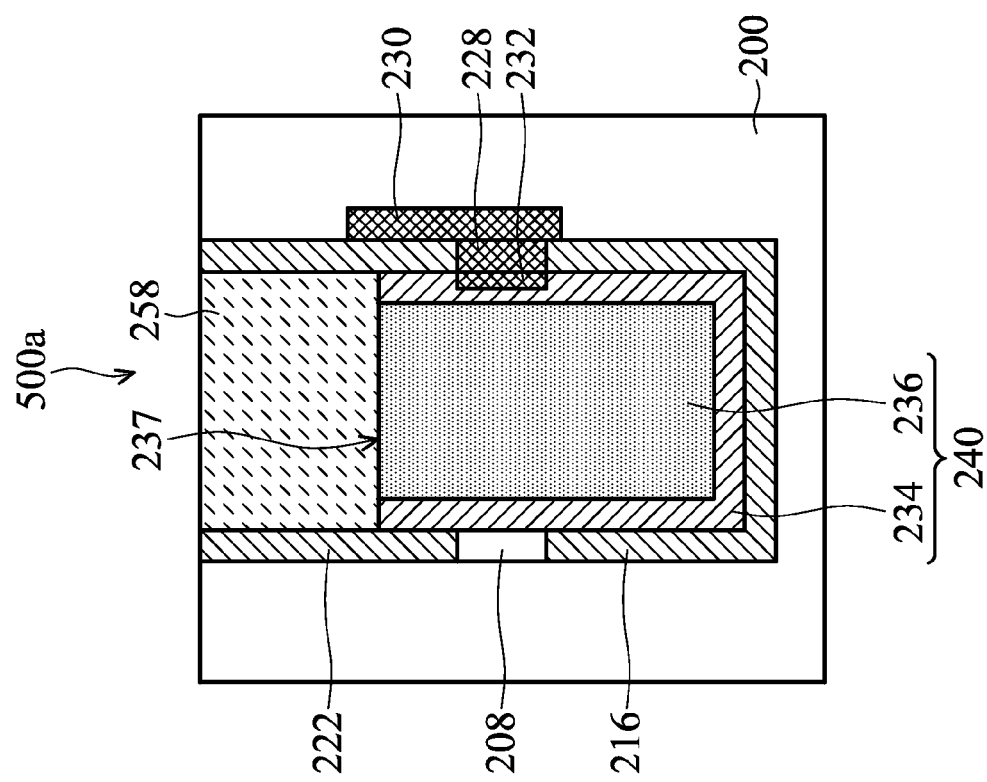

Next, referring to FIG. 11, a conductive plug 240 may be formed in the trench 210 using a PVD process, covering the sidewall of the diffusion source layer 228. As shown in FIG. 11, the conductive plug 240 covers the bottom insulating liner 216 and a portion of the top insulating liner 222, and a top surface 237 of the conductive plug 240 is lower than that of the substrate 200. In one embodiment, the conductive plug 240 may comprise an outer layer of a barrier layer 234 and an inner layer of a conductive layer 236, wherein the barrier layer 234 covers the bottom insulating liner 216 and a portion of the top insulating liner 222, and the conductive layer 236 covers the barrier layer 234. In one embodiment, the barrier layer 234 may comprise titanium (Ti), titanium nitride (TiN) or combinations thereof. Also, the conductive layer 236 may comprise tungsten (W). In one embodiment, the barrier layer 234a laminated layer constructed by titanium (Ti) and titanium nitride (TiN). Next, a capping layer 258 may be formed in the trench 210, covering the conductive plug 240 using a CVD process and a subsequent planarization process such as a chemical mechanical polishing (CMP) process. In one embodiment, a top surface of the capping layer 258 is coplanar with the surface of the substrate 200, thereby completing forming one exemplary embodiment of a buried bit line 500a of the invention.

One exemplary embodiment of a bit line 500a of, for example, a dynamic random access memory cell (DRAM) of the invention is provide, wherein the bit line 500a electrically connects to the overlying vertical transistor through the diffusion source layer 228 disposed at one side of the trench 210 and the diffusion region 230 adjacent to the diffusion source layer 228. Additionally, the diffusion source layer 228 is adjacent to the blocking layer 208. Also, the diffusion source layer 228 and the blocking layer 208 are at the same level.

Figure 12A:
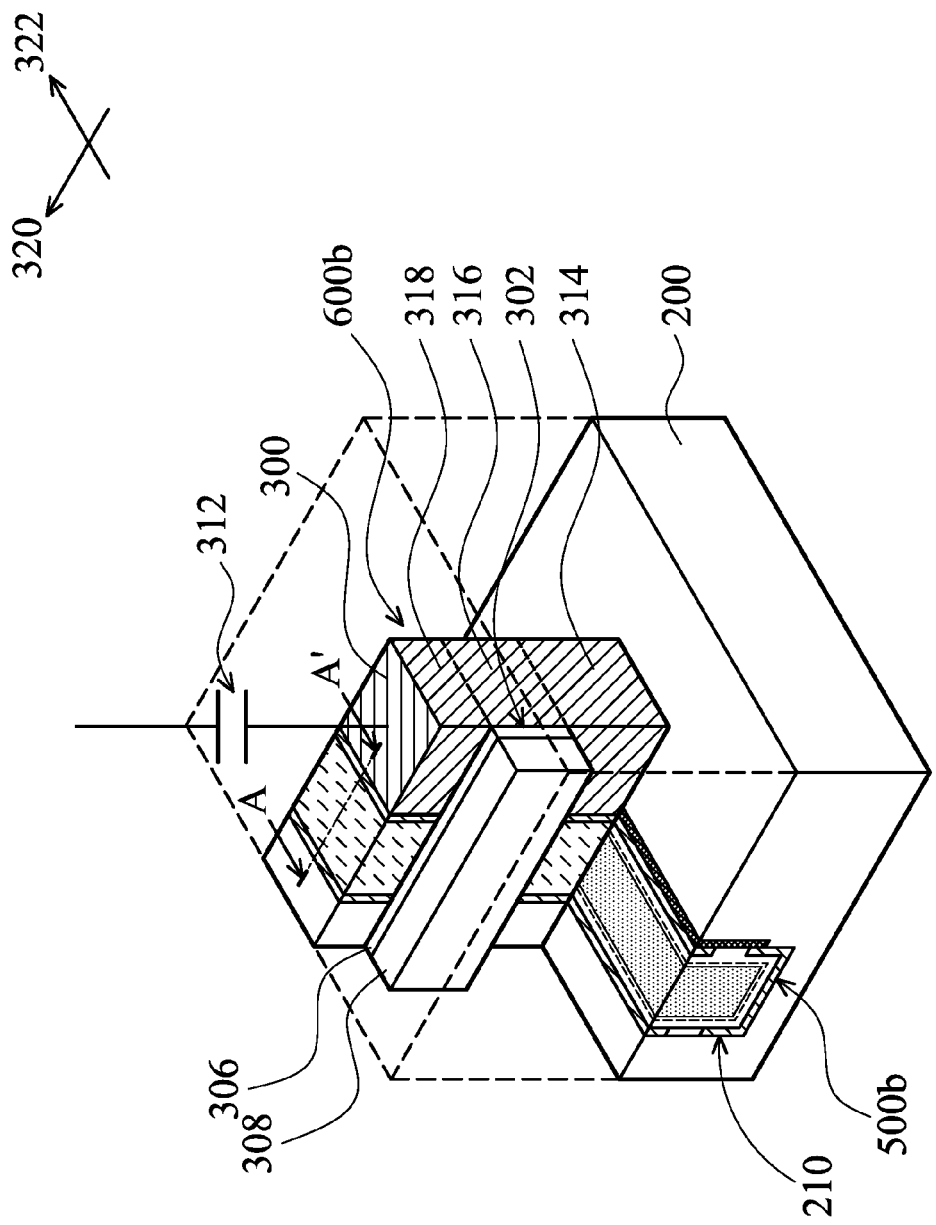
FIG. 12a is a perspective view showing another exemplary embodiment of a dynamic random access memory cell of the invention.
Figure 12B:
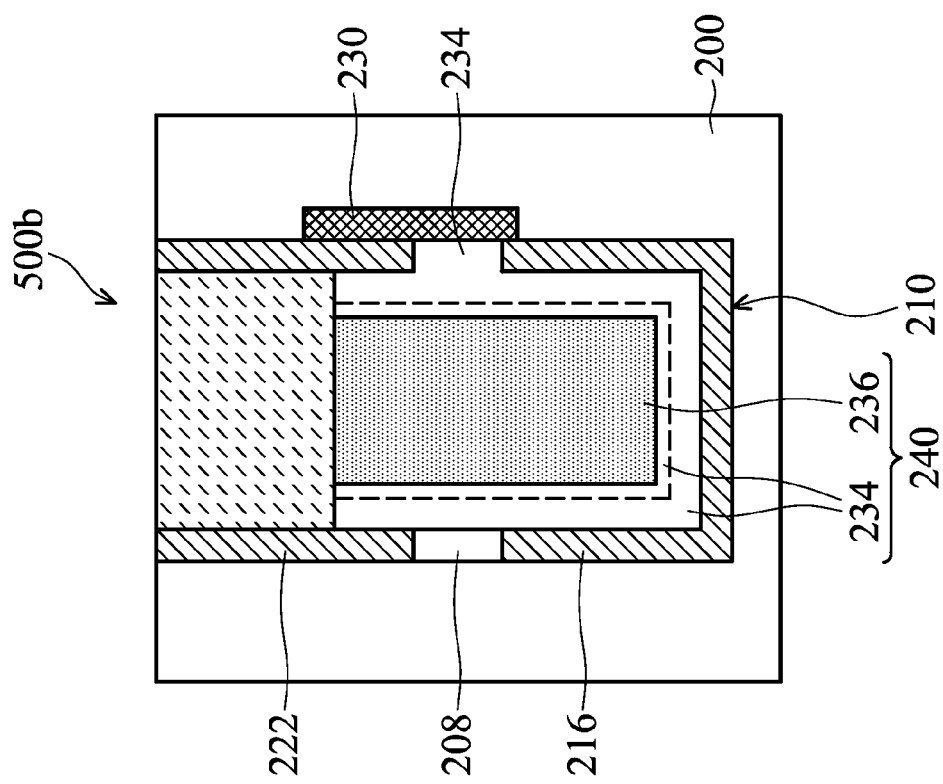
FIG. 12b is a cross section view taken of a line A-A' of FIG. 12a, showing another exemplary embodiment of a bit line of a dynamic random access memory cell of the invention.
Figure 13:
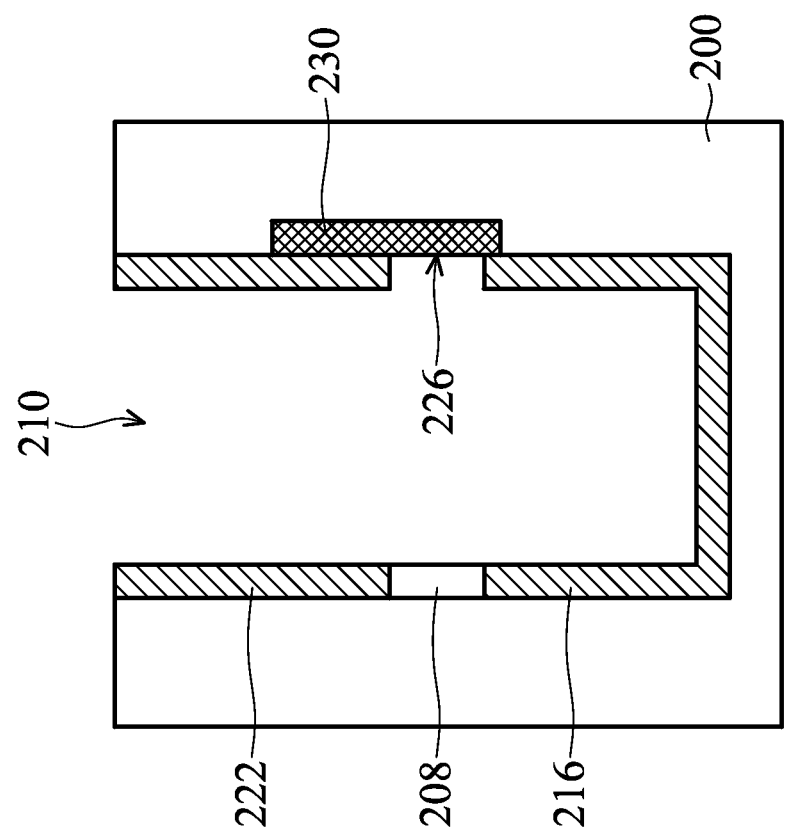
FIGS. 13-14 are cross section views for fabricating another exemplary embodiment of a bit line of a dynamic random access memory cell of the invention.
Figure 14:
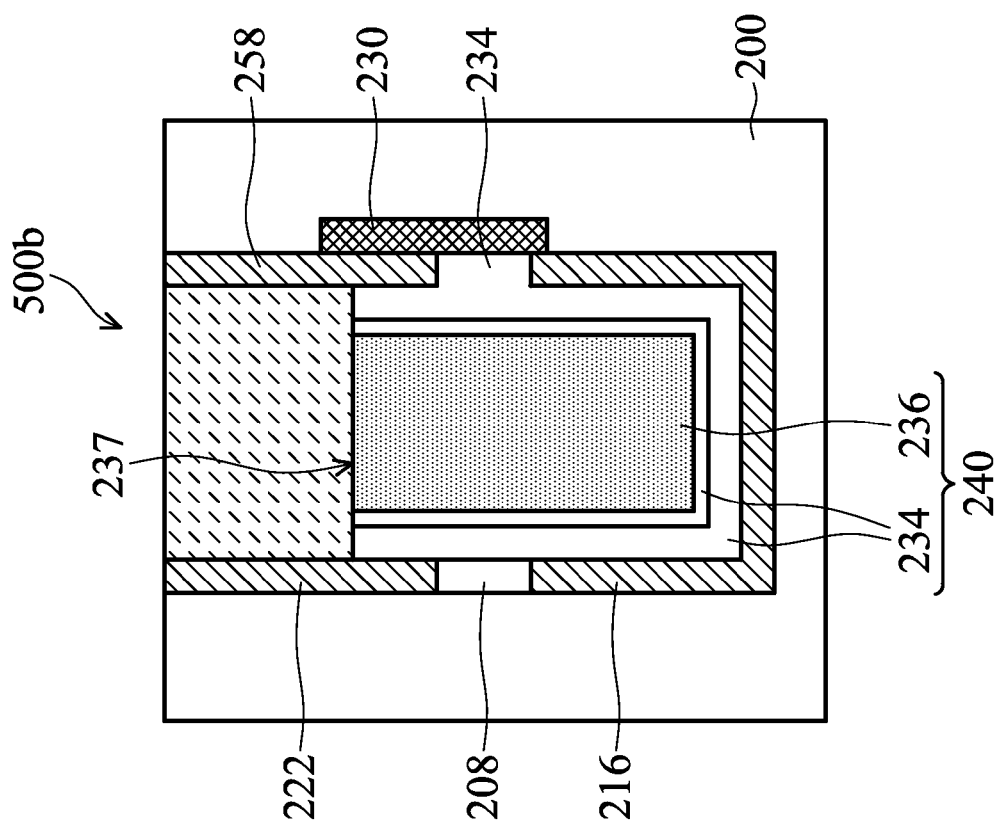

FIG. 12a is a perspective view showing another exemplary embodiment of a dynamic random access memory cell 600b of the invention. FIG. 12b is across section view taken of a line A-A' of FIG. 12a, showing another exemplary embodiment of a buried bit line 500b of a dynamic random access memory cell 600b of the invention. FIGS. 13-14 are cross section views for fabricating another exemplary embodiment of a buried bit line 500b of a dynamic random access memory cell 600b of the invention. Elements of the embodiments hereinafter, that are the same or similar as those previously described with reference to FIGS. 1a-11, are not repeated for brevity.

FIG. 12a is a perspective view showing another exemplary embodiment of a dynamic random access memory cell 600b of the invention. FIG. 12b is across section view taken of a line A-A' of FIG. 12a, showing another exemplary embodiment of a buried bit line 500b of a dynamic random access memory cell 600b of the invention. A difference between the buried bit line 500b of a dynamic random access memory cell 600b and the buried bit line 500a of a dynamic random access memory cell 600a as shown in FIGS. 1a and 1b is the buried bit line 500b does not include a diffusion source layer 228. FIGS. 13-14 will describe a method for fabricating a buried bit line 500b of a dynamic random access memory cell 600b of the invention.

FIGS. 13-14 are cross section views for fabricating another exemplary embodiment of a buried bit line 500b of a dynamic random access memory cell 600b of the invention, especially for a method for fabricating the buried bit line 500b having a diffusion region 230 only. Referring to FIG. 13, a blocking layer 208 is formed in a trench 210, a top insulating liner 222 and a bottom insulating liner 216. After removing a portion of the blocking layer 208 to expose a sidewall portion 226 of the trench 210, a pre-cleaning process may be performed to remove a native oxide on the sidewall 226 of the trench 210. Next, a dopant-containing gas is introduced from the exposed sidewall portion 226 of the trench 210 into a portion of the substrate 200 adjacent to the sidewall portion 226, thereby forming a diffusion region 230 using a gas/vapor doping process. In one embodiment, the gas/vapor doping process may comprise a thermal rapid vapor-phase doping (RVD) process, a room temperature vapor-phase doping (RTVD) process, a gas immersion laser doping (GILD) process or the like. In one embodiment, the diffusion region 230 may serve as a diffusion junction between the bit line and the vertical transistor. In one embodiment which a conductive type of the substrate 200 is p-type, a conductive type of the diffusion region 230 is n-type. The conductive type of the diffusion region 230 is defined according to a conductive type of the dopant-containing gas, but not limited to the disclosed embodiments. As shown in FIG. 13, the diffusion region 230 and the blocking layer 208 are substantially at the same level.

Next, referring to FIG. 14, a conductive plug 240 may be formed in the trench 210 using a PVD process, covering sidewalls of the blocking layer 208 and the diffusion region 230. As shown in FIG. 14, the conductive plug 240 covers the bottom insulating liner 216 and a portion of the top insulating liner 222, also, a top surface 237 of the conductive plug 240 is lower than that of the substrate 200. In one embodiment, the conductive plug 240 may comprise an outer layer of a barrier layer 234 and an inner layer of a conductive layer 236, wherein the barrier layer 234 respectively covers the bottom insulating liner 216 and a portion of the top insulating liner 222, and the conductive layer 236 covers the barrier layer 234. In one embodiment, the barrier layer 234 may comprise titanium (Ti), titanium nitride (TiN) or combinations thereof. Also, the conductive layer 236 may comprise tungsten. In one embodiment, the barrier layer 234a laminated layer constructed by titanium (Ti) and titanium nitride (TiN). Next, a capping layer 258 such as an oxide layer may be formed in the trench 210, covering the conductive plug 240 using a CVD process and a subsequent planarization process such as chemical mechanical polishing (CMP) process. In one embodiment, a top surface of the capping layer 258 is coplanar with the surface of the substrate 200, thereby completing forming another exemplary embodiment of a buried bit line 500b of the invention.

Another exemplary embodiment of a bit line 500b of, for example, a dynamic random access memory cell (DRAM) of the invention is provide, wherein the bit line 500b electrically connects to the overlying vertical transistor only through the diffusion region 230. Additionally the diffusion region 230 and the blocking layer 208 are substantially at the same level.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A buried bit line disposed in a trench of a substrate, comprising:
    a diffusion region formed in a portion of the substrate, adjacent to only one of two opposite sidewalls of the trench;
    a blocking layer formed on a portion of only the other of the two opposite sidewalls of the trench;
    a conductive plug formed in the trench, covering sidewalls of the diffusion region and the blocking layer;
    a bottom insulating liner covering a lower sidewall portion and a bottom surface of the trench; and
    a top insulating liner covering an upper sidewall portion of the trench, wherein the bottom insulating liner and the top insulating liner are separated from each other, and wherein the diffusion region is adjacent to the sidewall of the trench not covered by the bottom insulating liner and the top insulating liner,
    wherein the conductive plug comprises:
        a barrier layer formed in the trench, covering the bottom insulating liner and a portion of the top insulating liner; and
        a conductive layer formed in the trench, covering the barrier layer.

2. The buried bit line as claimed in claim 1, further comprising:
    a diffusion source layer formed only on the one of two opposite sidewalls of the trench not covered by the bottom insulating liner and the top insulating liner, adjacent to the diffusion region, wherein a dopant of the diffusion region is diffused from the diffusion source layer.

3. The buried bit line as claimed in claim 1, wherein the barrier layer covers the two opposite sidewalls of the trench, the bottom insulating liner and the top insulating liner.

4. The buried bit line as claimed in claim 1, wherein the barrier layer comprises a lamination structure, and materials of the barrier layer comprise Ti, TiN or combinations thereof.

5. The buried bit line as claimed in claim 1, further comprising a capping layer formed in the trench, covering the conductive plug.

6. The buried bit line as claimed in claim 1, wherein the top insulating liner or the bottom insulating liner comprises an oxide layer, a nitride layer or combinations thereof.

7. The buried bit line as claimed in claim 1, wherein the diffusion region and the blocking layer are substantially at the same level.

8. The buried bit line as claimed in claim 2, further comprising a silicide layer covering a sidewall of the diffusion source layer.

9. The buried bit line as claimed in claim 2, wherein the diffusion source layer comprises doped polysilicon.

10. The buried bit line as claimed in claim 2, wherein the diffusion source layer and the blocking layer are substantially at the same level.

11. The buried bit line as claimed in claim 2, wherein the diffusion region is adjacent to the diffusion source layer.

12. A buried bit line process, comprising:
    providing a substrate;
    forming a trench in the substrate;
    forming a blocking layer on a portion of only one of two opposite sidewalls of the trench;
    forming a diffusion region in a portion of the substrate adjacent to only the other of the two opposite sidewalls of the trench;
    forming a conductive plug in the trench, covering a sidewall of the diffusion region
    conformably forming a bottom insulating liner covering a lower sidewall portion and a bottom surface of the trench;
    conformably forming a top insulating liner covering an upper sidewall portion of the trench, wherein the bottom insulating liner and the top insulating liner are separated from each other before forming the diffusion region, and wherein the diffusion region is adjacent to the sidewall of the trench not covered by the bottom insulating liner and the top insulating liner,
    wherein the conductive plug comprises:
        a barrier layer formed in the trench, covering the bottom insulating liner and a portion of the top insulating liner; and
        a conductive layer formed in the trench, covering the barrier layer.

13. The buried bit line process as claimed in claim 12, wherein the step of forming the bottom insulating liner comprising:
    forming a sub-trench in the substrate;
    conformably forming the blocking layer on a sidewall and a bottom surface of the sub-trench;
    removing a portion of the blocking layer and the a portion of the substrate underlying the blocking layer from the bottom surface of the sub-trench, thereby forming the trench; and
    conformably forming the bottom insulating liner on the bottom surface of the trench and the sidewall of the trench not covered by the blocking layer.

14. The buried bit line process as claimed in claim 12, wherein the step of the top insulating liner comprising:
    forming a photoresist in the trench, wherein the photoresist covers the bottom insulating liner and a portion of the blocking layer;
    removing the blocking layer not covered by the photoresist to expose an upper sidewall portion of the trench;
    forming the top insulating liner on the exposed upper sidewall portion of the trench; and
    removing the photoresist.

15. The buried bit line process as claimed in claim 14, further comprising:
    forming a patterned photoresist in the trench, covering a portion of the blocking layer with exposing a portion of the bottom surface of the trench;
    removing the blocking layer not covered by the patterned photoresist to expose a portion of the sidewall of the trench; and
    removing the patterned photoresist before forming the diffusion region.

16. The buried bit line process as claimed in claim 14, further comprising:

filling an insulating layer in the trench;
forming a patterned photoresist to cover a portion of the insulating layer, wherein the patterned photoresist is adjacent to a portion of the top insulating liner at one side of the trench;
removing the insulating layer not covered by the patterned photoresist to expose a portion of the blocking layer;
removing the exposed blocking layer to expose a portion of the sidewall of the trench; and
removing the patterned photoresist and the insulating layer before forming the diffusion region.

17. The buried bit line process as claimed in claim 14, wherein the step of forming the conductive plug further comprising:

forming the barrier layer in the trench, covering the bottom insulating liner and a portion of the top insulating liner; and
forming the conductive layer in the trench, covering the barrier layer.

18. The buried bit line process as claimed in claim 15 or 16, further comprising forming a diffusion source layer on the exposed sidewall of the trench after removing the patterned photoresist.

19. The buried bit line process as claimed in claim 15 or 16, wherein forming the diffusion region comprising:

introducing a dopant-containing gas into a portion of the substrate from the exposed sidewall of the trench to form the diffusion region using a gas/vapor doping process.

20. The buried bit line process as claimed in claim 17, wherein the barrier layer covers the sidewall of the trench not covered by the bottom insulating liner and the top insulating liner.

21. The buried bit line process as claimed in claim 18, wherein the diffusion region is adjacent to the diffusion source layer.

22. The buried bit line process as claimed in claim 18, wherein further comprising forming a silicide layer in the trench covering a sidewall of the diffusion source layer before forming the conductive plug in the trench.

* * * * *